(12) United States Patent
Oshikiri

(10) Patent No.: US 8,090,958 B2
(45) Date of Patent: Jan. 3, 2012

(54) SEMICONDUCTOR MEMORY AND METHOD OF TESTING SEMICONDUCTOR MEMORY

(76) Inventor: Takashi Oshikiri, Hyogo (JP)

( * ) Notice: Subject to any disclaimer, the term of this patent is extended or adjusted under 35 U.S.C. 154(b) by 1266 days.

(21) Appl. No.: 11/261,520

(22) Filed: Oct. 31, 2005

(65) Prior Publication Data

US 2006/0129844 A1 Jun. 15, 2006

(30) Foreign Application Priority Data

Nov. 18, 2004 (JP) ................................ 2004-334373

(51) Int. Cl.
*G06F 12/14* (2006.01)

(52) U.S. Cl. ........ 713/190; 713/189; 713/193; 711/100; 711/164; 711/202

(58) Field of Classification Search .......... 713/189–194; 711/100, 164, 202; 726/34

See application file for complete search history.

(56) References Cited

U.S. PATENT DOCUMENTS

| | | | | |
|---|---|---|---|---|
| 4,525,599 A * | 6/1985 | Curran et al. | ................. | 713/190 |
| 4,558,176 A * | 12/1985 | Arnold et al. | ................. | 713/190 |
| 4,782,488 A * | 11/1988 | Anderson | ...................... | 713/190 |
| 5,095,525 A * | 3/1992 | Almgren et al. | ............. | 711/202 |
| 5,768,294 A * | 6/1998 | Chen et al. | ................... | 714/766 |
| 5,825,878 A * | 10/1998 | Takahashi et al. | ............ | 713/190 |
| 5,892,826 A * | 4/1999 | Brown et al. | .................. | 713/190 |
| 5,933,854 A | 8/1999 | Yoshimura | | |
| 6,438,726 B1 * | 8/2002 | Walters, Jr. | ................... | 714/764 |
| 6,510,071 B2 | 1/2003 | Oowaki | | |
| 2004/0128458 A1 * | 7/2004 | Buhr | ............................. | 711/164 |
| 2006/0107072 A1 * | 5/2006 | Umezu et al. | ................. | 713/193 |
| 2007/0192592 A1 * | 8/2007 | Goettfert et al. | ............. | 713/162 |

FOREIGN PATENT DOCUMENTS

| | | |
|---|---|---|
| EP | 0 864 983 A2 | 9/1998 |
| EP | 1 830 240 A1 | 9/2007 |
| JP | 58-161199 | 9/1983 |
| JP | 60-147659 | 8/1985 |
| JP | 60-150150 | 8/1985 |
| JP | 62-52650 | 3/1987 |
| JP | 3-134888 | 6/1991 |
| JP | 3-237699 | 10/1991 |
| JP | 4-106800 | 4/1992 |
| JP | 4-167157 | 6/1992 |
| JP | 5-46493 | 2/1993 |
| JP | 6-118140 | 4/1994 |
| JP | 6-324125 | 11/1994 |
| JP | 8-273400 | 10/1996 |
| JP | 8-328962 | 12/1996 |
| JP | 9-161493 | 6/1997 |
| JP | 10-260901 | 9/1998 |
| JP | 2000-181802 | 6/2000 |
| JP | 2000-251498 | 9/2000 |
| JP | 2001-250376 | 9/2001 |
| JP | 2002-208300 | 7/2002 |
| JP | 2005-80218 | 3/2005 |
| JP | 4119882 | 7/2008 |

* cited by examiner

*Primary Examiner* — Yin-Chen Shaw
(74) *Attorney, Agent, or Firm* — Oblon, Spivak, McClleland, Maier & Neustadt, L.L.P.

(57) ABSTRACT

A memory-specific tester has a buffer storing input pattern data and output expectation data. An address included in the input pattern data read from the buffer is sent to a semiconductor memory, and is then subjected to descrambling at a security circuit. The descrambled address is converted at an address conversion circuit to an address designating a region for storing a check pattern in a memory core. Data given from the memory core (check pattern) is subjected to scrambling at the security circuit, and is then sent to the memory-specific tester. The memory-specific tester makes comparison between expectation data and the data read from the semiconductor memory.

7 Claims, 8 Drawing Sheets

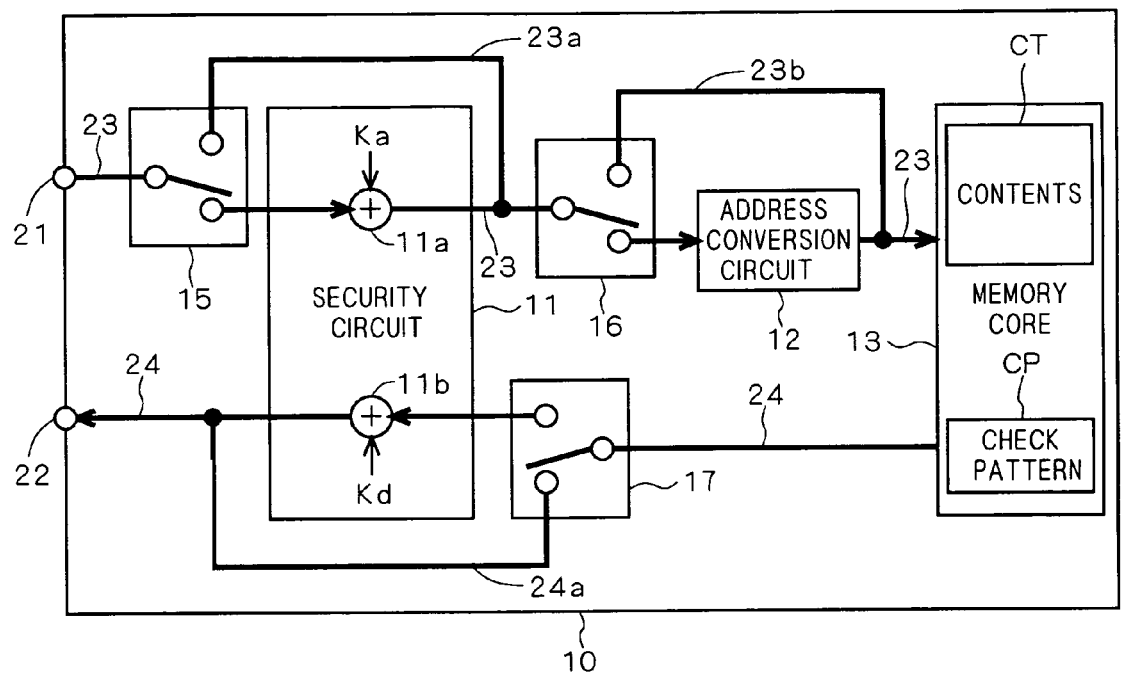
F I G . 1

SEMICONDUCTOR MEMORY AND METHOD OF TESTING SEMICONDUCTOR MEMORY

BACKGROUND OF THE INVENTION

1. Field of the Invention

The present invention relates to a technique of testing a semiconductor memory with built-in security features.

2. Description of the Background Art

In some semiconductor memories such as mask ROMs or some non-volatile memories, contents are stored in advance at the time of manufacture according to a user's order. A semiconductor memory of this type (hereinafter referred to as "semiconductor memory for content storage") may be given various security features to avoid unauthorized reading of stored contents.

Typical security features include descrambling of a received address signal at an exclusive OR circuit using predetermined key information, scrambling of a data signal to be output at an exclusive OR circuit using predetermined key information, and the like.

When a semiconductor memory for content storage equipped with these security features is tested before shipment, a memory is ideally subjected to reading in its entirety with security features activated to perform a total function test. However, such a complicated operational test through a conventional memory-specific tester requires considerably high test cost. Thus in general, a test targeted for a memory core alone (memory-core-only-test) and a test covering security features and a memory core (total function test) are independently performed.

The memory-core-only-test is equivalent to a test that has been performed on a conventional semiconductor memory with no security feature, and is intended to read a memory in its entirety. The memory-core-only-test should not be omitted in terms of reliability of a semiconductor memory. Such a test is a specialty of a memory-specific tester, and does not put pressure on test cost.

The total function test is not targeted for a conventional semiconductor memory with no security feature. Improvement in efficiency of the total function test is an important issue to realize reduction of the total cost of a semiconductor memory for content storage equipped with security features.

With reference to FIG. 6, a semiconductor memory 110 for content storage receives an address A0 from outside, and outputs data D0 corresponding to the address A0 from a memory core 113. An address bus and a data bus may be physically different. Alternatively, an address input cycle and a data output cycle may time-share a common bus.

FIG. 7 shows an example of a semiconductor memory for content storage with built-in security features. A semiconductor memory 110 for content storage has a security circuit 111 that includes a descrambling circuit 111a and a scrambling circuit 111b.

The descrambling circuit 111a receives a scrambled address A1, descrambles the address A1 using address key information Ka, and outputs a descrambled address A0 to the memory core 113. The memory core 113 outputs data D0 corresponding to the address A0.

The scrambling circuit 111b scrambles the data D0 using data key information Kd, and outputs scrambled data D1. The data D1 is sent to the outside of the semiconductor memory 110 for content storage.

In order to facilitate test before shipment, some semiconductor memories for content storage with built-in security features are provided with a path for bypassing a security circuit as shown in FIG. 8. This allows implementation of the memory-core-only-test. That is, in the implementation of the memory-core-only-test, the address A0 bypasses the security circuit 111 to be sent to the memory core 113 as shown by a solid line of FIG. 8. The data D0 read from the memory core 113 bypasses the security circuit 111 to be sent to the outside of the semiconductor memory 110 for content storage as also shown by a solid line of FIG. 8.

FIG. 9 shows how the memory-core-only-test is implemented using a memory-specific tester 130. The memory-specific tester 130 causes an address generation circuit 131 to automatically generate and output the address A0 to the semiconductor memory 110. The address A0 sequentially designates addresses from a start address to an end address.

In the implementation of the memory-core-only-test, the semiconductor memory 110 for content storage is controlled to bypass the security circuit 111 and data is read from the memory core 113. The data D0 given from the semiconductor memory 110 for content storage and output expectation data stored in a buffer 135 are sequentially compared in an expectation comparison circuit 133 to implement the memory-core-only test.

In the implementation of the memory-core-only-test, the data stored in the memory core 113 and the output expectation data stored in the buffer 135 are the same. The output expectation data should be replaced according to contents.

FIG. 10 shows how the total function test is implemented using the memory-specific tester 130. In the implementation of the total function test, the scrambled address A1 should be given to the semiconductor memory 100 for content storage. The memory-specific tester 130 cannot be operative to automatically generate the scrambled address.

Thus the scrambled address A1 should be stored in advance as input pattern data in the buffer 135. The memory-specific tester 130 sequentially reads the input pattern data from the buffer 135 and sends the read data as the scrambled address A1 to the semiconductor memory 110 for content storage.

In the semiconductor memory 110 for content storage, the descrambling circuit 111a descrambles the address A1 using the address key information Ka to generate the address A0. The address A0 is supplied to the memory core 113 and then the data D0 is read from the memory core 113. The data D0 is thereafter subjected to scrambling using the data key information Kd at the scrambling circuit 111b. The scrambled data D1 is given from the semiconductor memory 110 for content storage. In the memory-specific tester 130, the received data D1 and the output expectation data stored in the buffer 135 are sequentially compared at the expectation comparison circuit 133 to implement the total function test.

The memory-core-only-test and the total function test are implemented in the manner described above. Thus a semiconductor memory for content storage equipped with security features can be tested before shipment.

The above-described total function test suffers from a problem that a combination of the input pattern data and the output expectation data (hereinafter also referred to as "test pattern") stored in a buffer should be changed according to the contents stored in a semiconductor memory.

The output expectation data stored in a buffer should also be changed in the memory-core-only-test according to the contents in a memory. However, in order to ensure reliability of a memory, the memory-core-only test should not be omitted.

When a semiconductor memory for content storage equipped with security features is subjected to the memory-core-only-test and the total function test, a test pattern responsive to each test should be prepared, resulting in test cost increase.

If a memory tester has a large-sized buffer, a test pattern for the total function test and a test pattern for the memory-core-only-test can be separately stored in respective regions. In this case, both test patterns can be replaced at once in response to the change of the type of a semiconductor memory to be subjected to the tests. However, due to limitations on the capacity of a buffer, both test patterns cannot be stored in the same buffer in many cases. Thus in general, a test pattern is replaced by the following option (1) or (2):

(1) to replace a test pattern several times using one memory tester; or (2) to use a plurality of memory testers.

In either case, each output expectation data for use in the total function test and in the memory-core-only-test should be replaced respectively according to contents. This causes a heavy burden of generating test patterns, and such a burden is desirably reduced.

The option (2) requires reduced number of replacement operations of a test pattern as compared to the option (1). Thus the option (2) is expected to significantly reduce test cost, as long as a burden of generating test patterns for use in the total function test is reduced.

In order to tighten security, the key information Ka and Kd given to the security circuit 111 may be varied according to the contents stored in the memory core 113. In this case, in addition to the output expectation data, the input pattern data should also be changed according to the contents stored in the memory core 113. This causes a heavier burden of generating test patterns and requires complicated works of replacement of a test pattern.

SUMMARY OF THE INVENTION

The present invention is intended for test cost reduction of a total function test.

A semiconductor memory according to a first aspect of the present invention comprises: an address conversion circuit configured to convert an address with no security protection to an address designating a predetermined storage region; a memory core having the predetermined storage region storing a check pattern; and a security processing circuit including at least a security release circuit or a security protection circuit. The security release circuit is configured to release an address subjected to first security protection from the first security protection. The security protection circuit is configured to provide second security protection to data sent from the memory core.

According to a second aspect of the semiconductor memory of the present invention, in the semiconductor memory of the first aspect, the security processing circuit includes the security release circuit. The semiconductor memory further comprises a first path configured to allow an address received at the semiconductor memory to bypass the security processing circuit; and a second path configured to allow an address received at the semiconductor memory to bypass the address conversion circuit.

According to a third aspect of the semiconductor memory of the present invention, in the semiconductor memory of the first aspect, the security processing circuit includes the security protection circuit. The semiconductor memory further comprises a path configured to allow the data sent from the memory core to bypass the security processing circuit.

A first aspect of a method of testing a semiconductor memory is intended to test the second aspect of the semiconductor memory of the present invention. This method comprises the steps of: providing input pattern data subjected to the first security protection to the security release circuit to obtain the address with no security protection; sending the address with no security protection from the security release circuit to the address conversion circuit to obtain an address designating the predetermined storage region; providing the address designating the predetermined storage region to the memory core to obtain the check pattern; and making comparison between data given from the semiconductor memory based on the check pattern and an expectation of the data.

A second aspect of the method of testing a semiconductor memory is intended to test the third aspect of the semiconductor memory of the present invention. This method comprises the steps of: providing the address with no security protection to the address conversion circuit to obtain an address designating the predetermined storage region; providing the address designating the predetermined storage region to the memory core to obtain the check pattern; providing the check pattern to the security protection circuit to provide the second security protection to the check pattern; and making comparison between data given from the security protection circuit and an expectation of the data.

In the present invention, an address given to the memory core designates a region storing a check pattern. Thus when the operation of a semiconductor memory including the security processing circuit and the memory core is tested, a test pattern can be shared among different contents stored in the semiconductor memory. This does not require replacement of a test pattern to thereby allow test cost reduction.

By bypassing the security processing circuit and the address conversion circuit, a test targeted for a memory core alone can be easily realized by a commonly-applied memory-specific tester.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 shows a circuit diagram of a semiconductor memory according to a preferred embodiment of the present invention;

DESCRIPTION OF THE PREFERRED EMBODIMENTS

Figure 2:
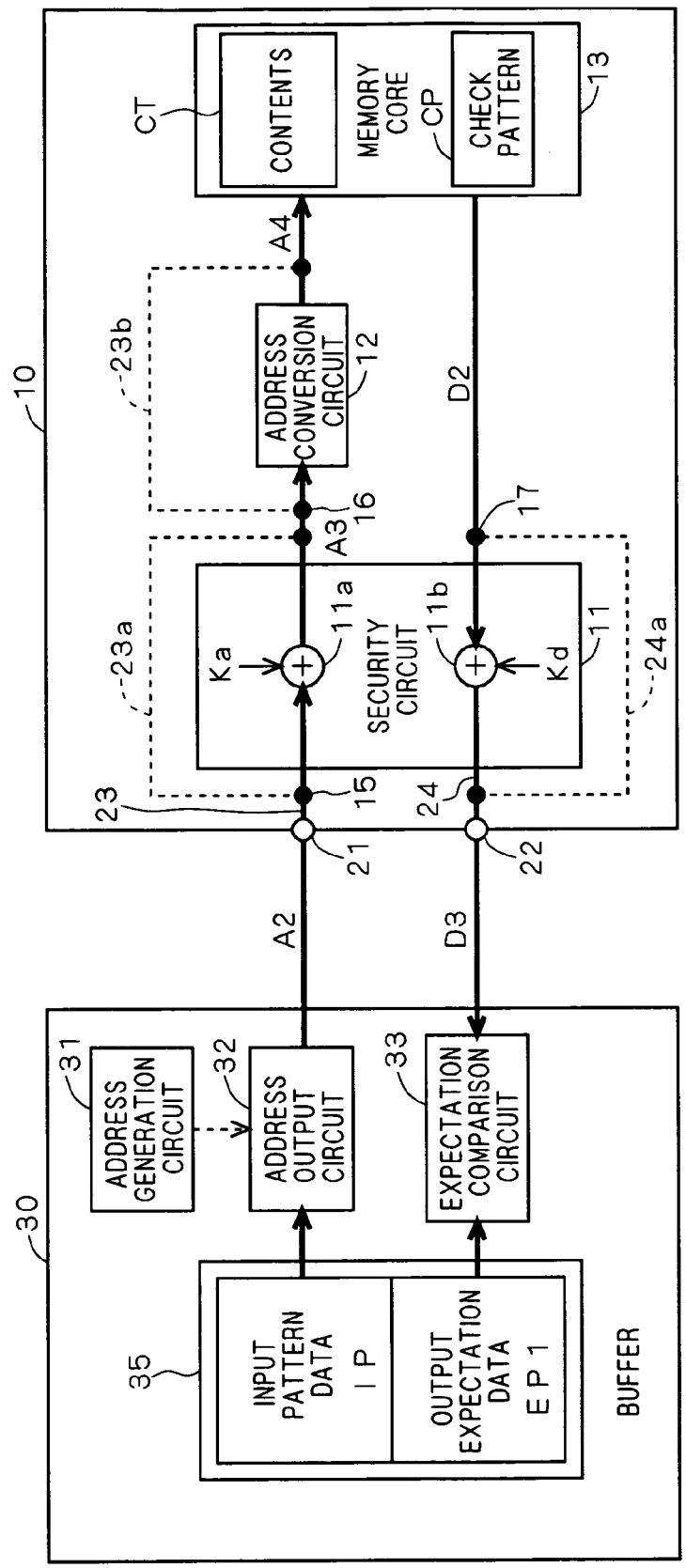
FIG. 2 shows how the semiconductor memory of the preferred embodiment of the present invention operates in the implementation of a total function test.

A preferred embodiment of the present invention will be discussed below with reference to drawings. FIG. 1 shows a circuit diagram of a semiconductor memory 10 according to the preferred embodiment of the present invention. The semiconductor memory 10 has a security circuit 11, an address conversion circuit 12 and a memory core 13.

In the preferred embodiment of the present invention, the semiconductor memory 10 is a mask ROM and contents data CT has been stored in advance in the memory core 13 at the time of shipment of the semiconductor memory 10. The contents data CT contain programs and various kinds of data. As an example, a game program may be stored as the contents data CT so that the semiconductor memory 10 is operative to function as a gate cartridge.

The semiconductor memory 10 has an input end 21 and an output end 22. An address bus 23 is connected to the input end 21. The address bus 23 is further connected to a switching circuit 15 arranged on the address input side of the security circuit 11. The address bus 23 is divided into two branches at the switching circuit 15. One branch leads to the security circuit 11 and the other branch leads to a path 23a. The path 23a bypasses the security circuit 11 to join an address bus 23 at the address output side of the security circuit 11.

The address bus 23 is further connected to a switching circuit 16 arranged on the address input side of the address conversion circuit 12. The address bus 23 is divided into two branches at the switching circuit 16. One branch leads to the address conversion circuit 12 and the other branch leads to a path 23b. The path 23b bypasses the address conversion circuit 12 to join the address bus 23 at the address output side of the address conversion circuit 12.

The address bus 23 on the output side of the address conversion circuit 12 is connected to the memory core 13. With the configuration discussed so far, an address is supplied from the input end 21 to the memory core 13 through the address bus 23.

A data bus 24 is connected to the memory core 13. The data bus 24 is connected to a switching circuit 17 arranged on the data input side of the security circuit 11 at which the data bus 24 is divided into two branches. One branch of the data bus 24 leads to the security circuit 11 and the other branch leads to a path 24a. The path 24a bypasses the security circuit 11 to join the data bus 24 at the data output side of the security circuit 11.

The data bus 24 on the data output side of the security circuit 11 is connected to the output end 22. With the configuration discussed so far, data is transferred to the outside of the semiconductor memory 10 through the data bus 24.

Next, it will be discussed how the semiconductor memory 10 with the above-described configuration is tested before shipment. FIG. 2 shows how a total function test of the semiconductor memory 10 is implemented using a memory-specific tester 30. The total function test is intended to evaluate the functions of the semiconductor memory 10 including at least the memory core 13 and the security circuit 11.

The memory-specific tester 30 has an address generation circuit 31, an address output circuit 32, an expectation comparison circuit 33 and a buffer 35. The buffer 35 stores input pattern data IP and output expectation data EP1 previously prepared for the implementation of the total function test of the semiconductor memory 10.

The input pattern data IP includes a previously-scrambled address A2 to be supplied to the semiconductor memory 10. The input pattern data IP contains various kinds of previously-scrambled addresses. Further, scrambled addresses should be descrambled in an operation circuit 11a of the security circuit 11.

In the preferred embodiment of the present invention, the operation circuit 11a is responsible for an exclusive OR operation to obtain an address A3 released from scrambling, for example. The scrambled address A2 and the address key information Ka are exclusive-ORed at the operation circuit 11a. The address key information Ka and data equivalent to the address A3 are exclusive-ORed previously, and a result obtained therefrom is applied as the input pattern data IP.

The output expectation data EP1 is formed by scrambling an expectation of data D2 given from the memory core 13. This scrambling for generating the output expectation data EP1 is equivalent to the scrambling at an operation circuit 11b of the security circuit 11.

In the preferred embodiment of the present invention, the operation circuit 11b is responsible for exclusive OR operation, for example. The data D2 given from the memory core 13 and data key information Kd are exclusive-ORed at the operation circuit 11b. The data key information Kd and an expectation of the data D2 are exclusive-ORed, and a result obtained therefrom is applied as the output expectation data EP1.

The total function test will be discussed. First, the address output circuit 32 reads the input pattern data IP from the buffer 35 to sequentially supply the scrambled address A2 to the semiconductor memory 10. That is, various kinds of scrambled addresses contained in the input pattern data IP are supplied one by one to the semiconductor memory 10. The address generation circuit 31 is not used in the total function test discussed here.

In the implementation of the total function test, the semiconductor memory 10 is controlled so that the received address A2 is given to the security circuit 11. That is, the switching circuit 15 is controlled to provide a received signal to the security circuit 11, whereby the address A2 supplied from the memory-specific tester 30 is given to the security circuit 11. The address A2 given to the security circuit 11 is subjected to descrambling at the operation circuit 11a.

As discussed above, the input pattern data IP has been scrambled in such a manner that it can be descrambled at the operation circuit 11a. Thus the operation circuit 11a is allowed to precisely descramble the address A2 to obtain the address A3.

In the implementation of the total function test, the semiconductor memory 10 is controlled so that the address A3 is given to the address conversion circuit 12. That is, the switching circuit 16 is controlled to provide a received signal to the address conversion circuit 12, whereby the descrambled address A3 is given to the address conversion circuit 12. The address conversion circuit 12 serves to convert a received address to a signal designating a specific address region.

Figure 3:
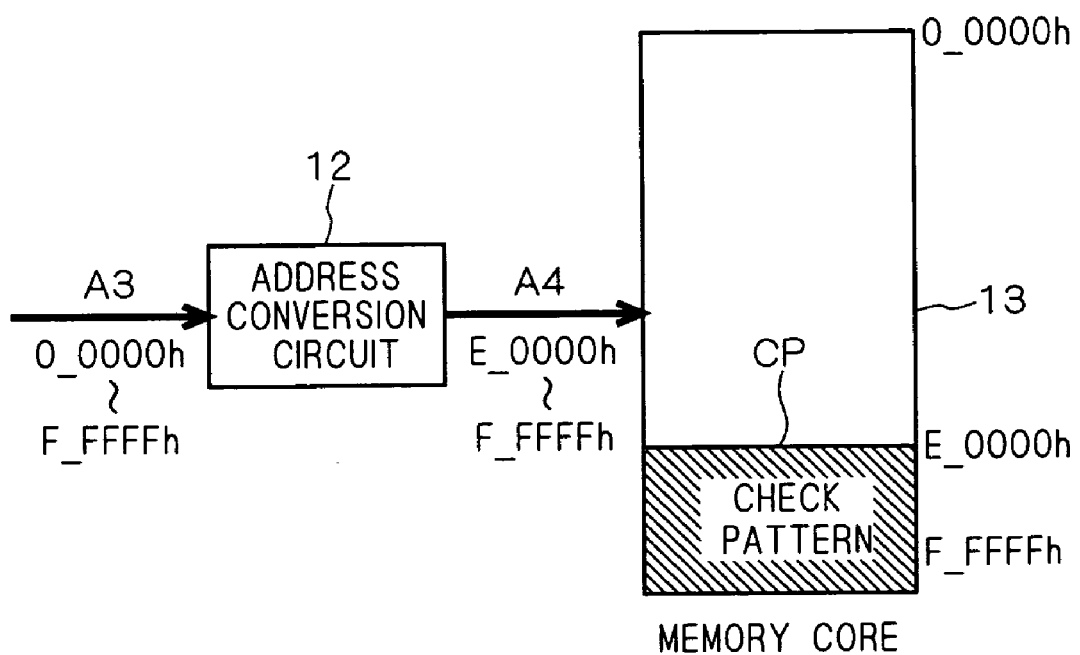
FIG. 3 shows an example of address conversion.

FIG. 3 shows an example of address conversion at the address conversion circuit 12. As an example, it is assumed that the memory core 13 is a mask ROM having an address region extending from 0_0000h to F_FFFFh that is divided on a byte basis, namely, a mask ROM having a storage region of 1 megabyte. That is, addresses are represented in 20 bits. A region extending from E_0000h to F_FFFFh of the memory core 13 is defined as a region for storing a check pattern CP for use in the total function test.

In this example, the address conversion circuit 12 converts a received address designating the region from 0_0000h to F_FFFFh to an address designating the region E_0000h to F_FFFFh storing the check pattern CP. More specifically, the address conversion circuit 12 fixes the high-order three bits of the received address A3 at "111".

Then the address A2 supplied from the memory-specific tester 30 is converted to the descrambled address A3 that is further converted to an address A4 designating only a region for storing the check pattern CP.

The address A4 sent from the address conversion circuit 12 is supplied to the memory core 13. The check pattern CP stored in the address region given from the address conversion circuit 12 is intended for use in the total function test.

That is, the output expectation data EP1 stored in the buffer 35 of the memory-specific tester 30 is given by scrambling the check pattern CP.

The region allocated to the check pattern CP is a part of the memory core 13 and different from a region allocated to the contents data (see FIG. 2).

Again, in the preferred embodiment of the present invention, the check pattern CP is stored in a specific region of the memory core 13. Then in the implementation of the total function test, the received scrambled address A2 is descrambled and is thereafter converted at the address conversion circuit 12, thereby reading the check pattern CP from fixed addresses.

The data D2 (check pattern CP) given from the memory core 13 is sent through the data bus 24 to the security circuit 11. In the implementation of the total function test, the semiconductor memory 10 is controlled so that the data D2 is given to the security circuit 11. That is, the switching circuit 17 is controlled to provide a received signal to the security circuit 11, whereby the data D2 (check pattern CP) given from the memory core 13 is subjected to scrambling at the operation circuit 11b.

Scrambled data D3 is sent through the data bus 24 and the output end 22 to the memory-specific tester 30. In the memory-specific tester 30, the output expectation data EP1 stored in the buffer 35 and the scrambled data D3 given from the semiconductor memory 10 are compared at the expectation comparison circuit 33.

This comparison realizes implementation of the total function test. That is, if the output expectation data EP1 and the data D3 given from the semiconductor memory 10 coincide with each other, the correctness of the total function of the semiconductor memory 10 is verified Following the processes described above, the total function test of the semiconductor memory 10 is realized that includes the security circuit 11, memory core 13, input and output ends of the security circuit 11, input and output ends of the memory core 13, and address bus 23 and data bus 24 connecting the security circuit 11 and memory core 13.

The check pattern CP can be constant regardless of the details of the contents data CT stored in the memory core 13. That is, the same check pattern CP can be shared among different types of semiconductor memory 10.

Thus the output expectation data EP1 stored in the buffer 35 of the memory-specific tester 30 can be constant. Then for the implementation of the total function test of semiconductor memories of various types storing different contents, an expectation stored in a buffer of a memory-specific tester is not required to be replaced, thereby leading to test cost reduction.

Figure 4:
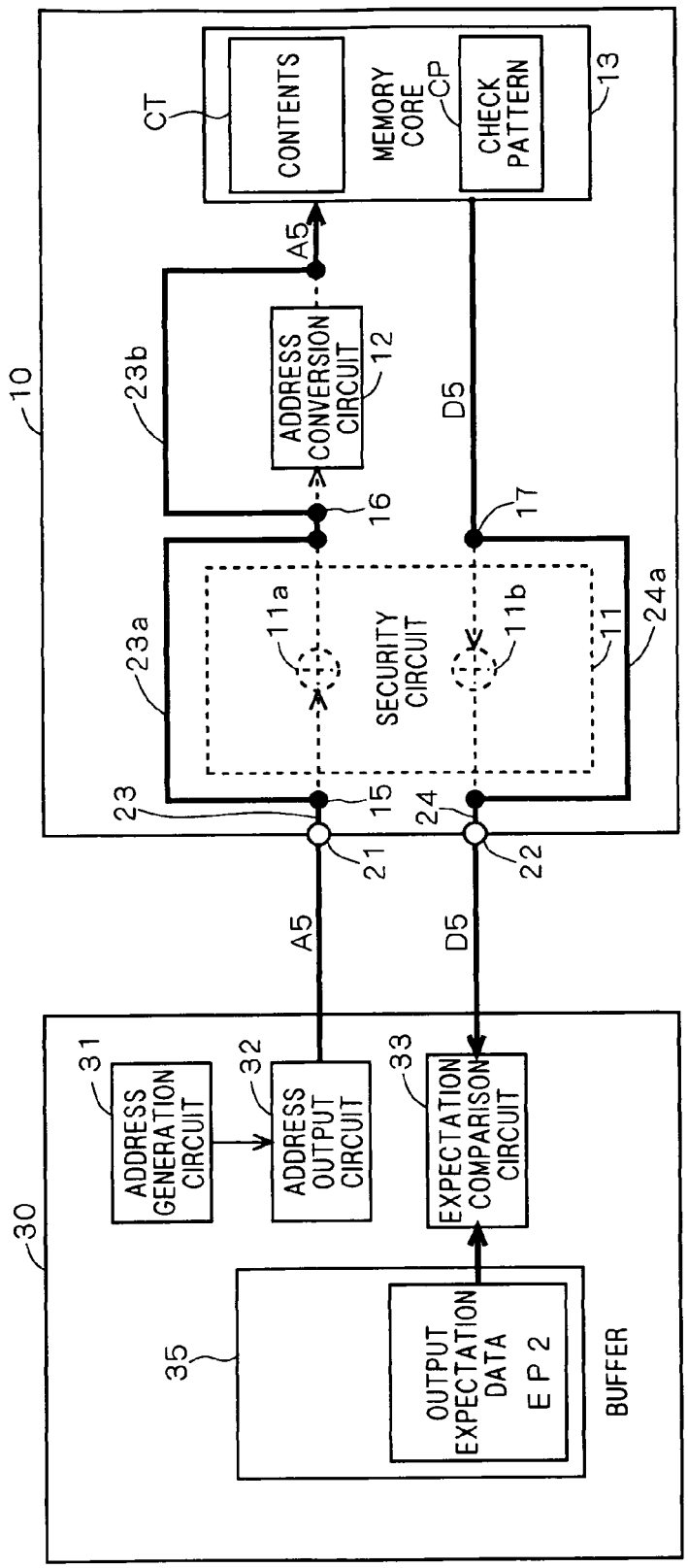
FIG. 4 shows how the semiconductor memory of the preferred embodiment of the present invention operates in the implementation of a memory-core-only-test.

Next, the memory-core-only-test will be discussed. The memory-core-only-test is intended to verify the accuracy of data stored in the memory core 13. The security circuit 11 is bypassed in the implementation of the memory-core-only-test. FIG. 4 shows how the memory-core-only-test is implemented. For the implementation of the memory-core-only-test, the memory-specific tester 30 automatically generates addresses at the address generation circuit 31 that are to be supplied to the semiconductor memory 10. More specifically, all addresses including a start address and an end address are automatically designated.

In the implementation of the memory-core-only-test, the address automatic generating function is used and hence the buffer 35 is not required to hold input pattern data, while the buffer 35 stores output expectation data EP2 equivalent to the contents data CT stored in the memory 13 subjected to reading in its entirety. It can be arbitrarily determined whether the check pattern CP is also a target of reading when the memory core 13 is being subjected to reading in its entirety.

The address output circuit 32 sequentially supplies automatically generated addresses to the semiconductor memory 10. In the implementation of the memory-core-only-test, the semiconductor memory 10 is controlled so that a received address A5 bypasses the security circuit 11. That is, the switching circuit 15 is controlled to provide a received signal to the path 23a.

In the implementation of the memory-core-only-test, the semiconductor memory 10 is controlled so that the received address A5 bypasses the address conversion circuit 12. That is, the switching circuit 16 is controlled to provide a received signal to the path 23b. Thus the address A5 received at the input end 21 is directly supplied to the memory core 13. The memory core 13 sends the contents data CT as data D5 stored at the address A5.

The data D5 (contents data CT) sent from the memory core 13 is supplied to the switching circuit 17. In the implementation of the memory-core-only-test, the semiconductor memory 10 is controlled so that the received data D5 bypasses the security circuit 11. That is, the switching circuit 17 is controlled to provide a received signal to the path 24a.

As a result, the data D5 sent from the memory core 13 (contents data CT) is directly received at the output end 22, then entering the memory-specific tester 30.

In the memory-specific tester 30, the output expectation data EP2 and the data D5 sent from the semiconductor memory 10 (contents data CT) are compared at the expectation comparison circuit 33. This comparison realizes implementation of the memory-core-only-test.

That is, if the output expectation data EP2 and the contents data CT coincide with each other, the correctness of the memory core 13 is verified.

Figure 5:
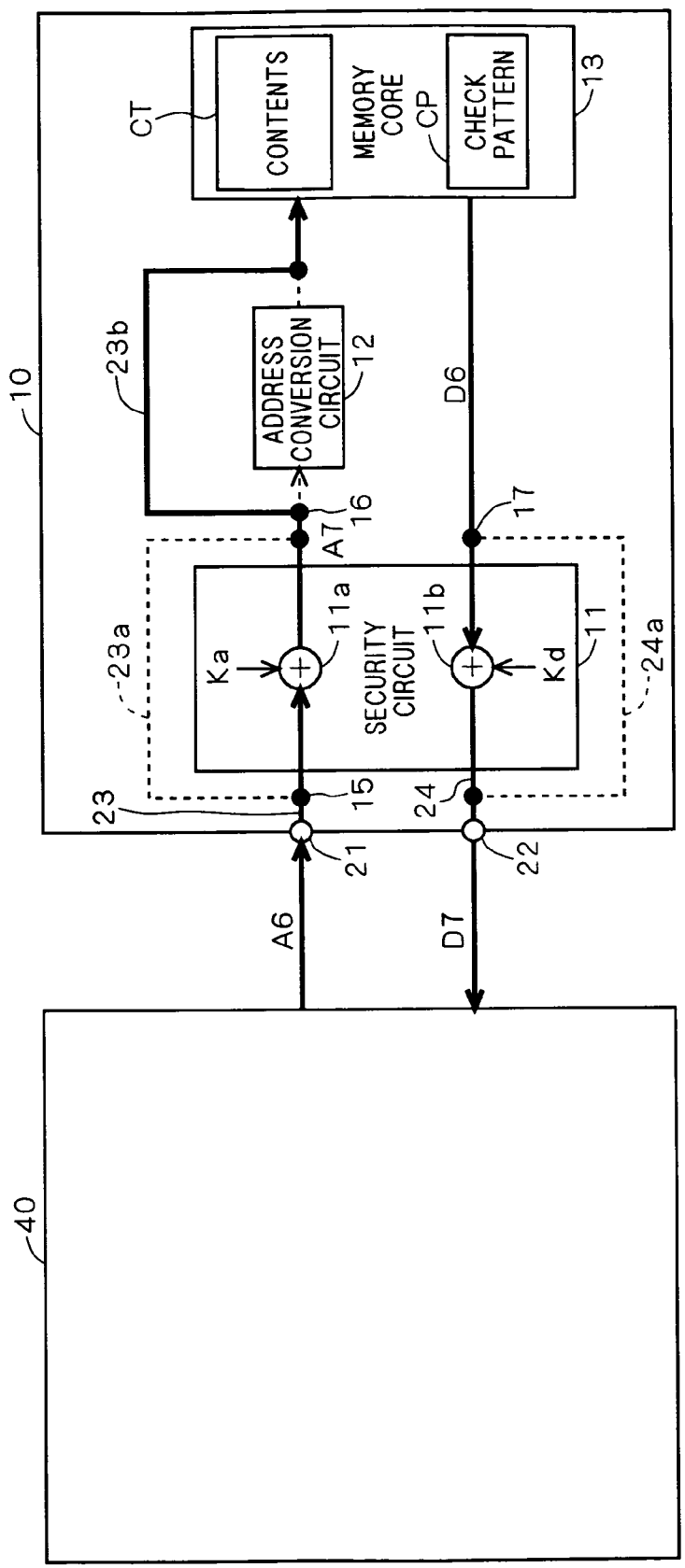
FIG. 5 shows how the semiconductor memory of the preferred embodiment of the present invention operates in a normal mode.
Figure 6:
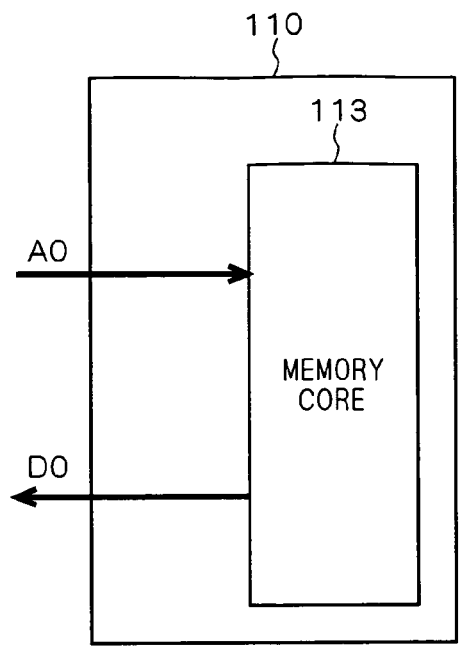
FIG. 6 shows general input and output of a semiconductor memory.
Figure 7:
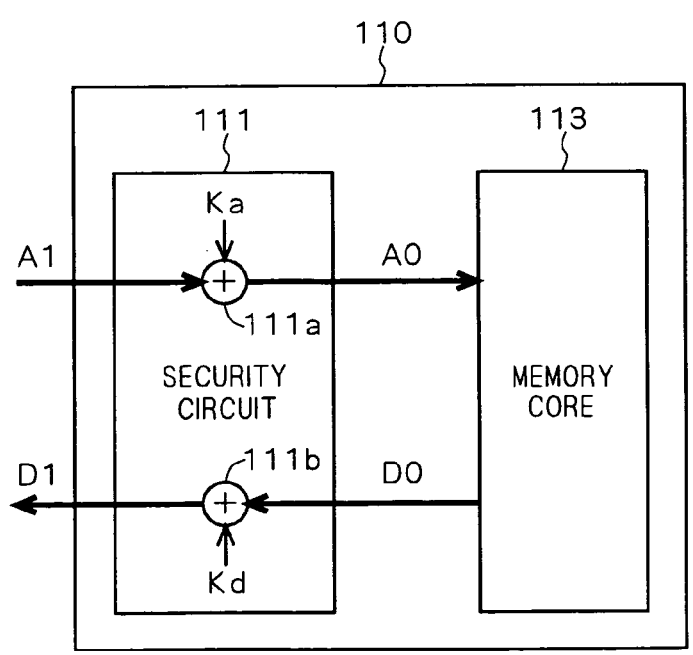
FIG. 7 shows input and output of a semiconductor memory provided with a security circuit.
Figure 8:
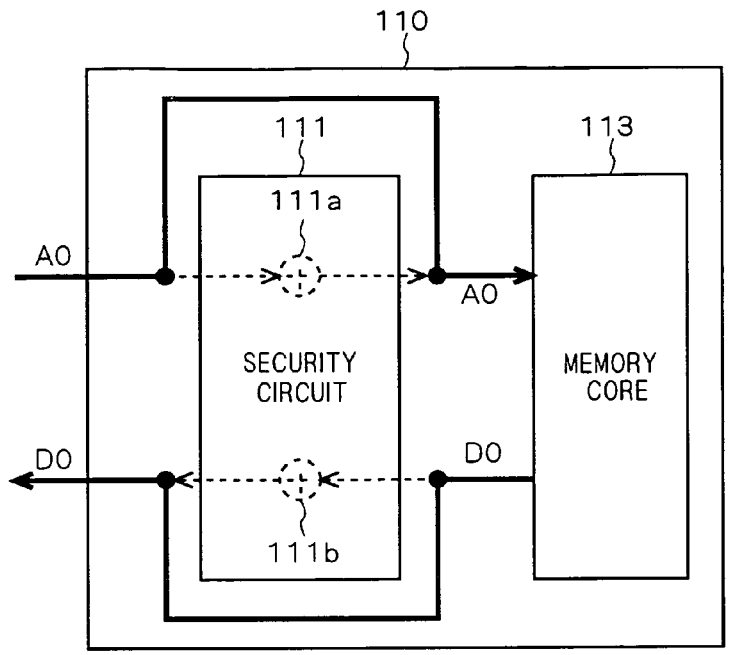
FIGS. 8, 9 and 10 each show how the semiconductor memory provided with a security circuit operates in the implementation of a test.
Figure 9:
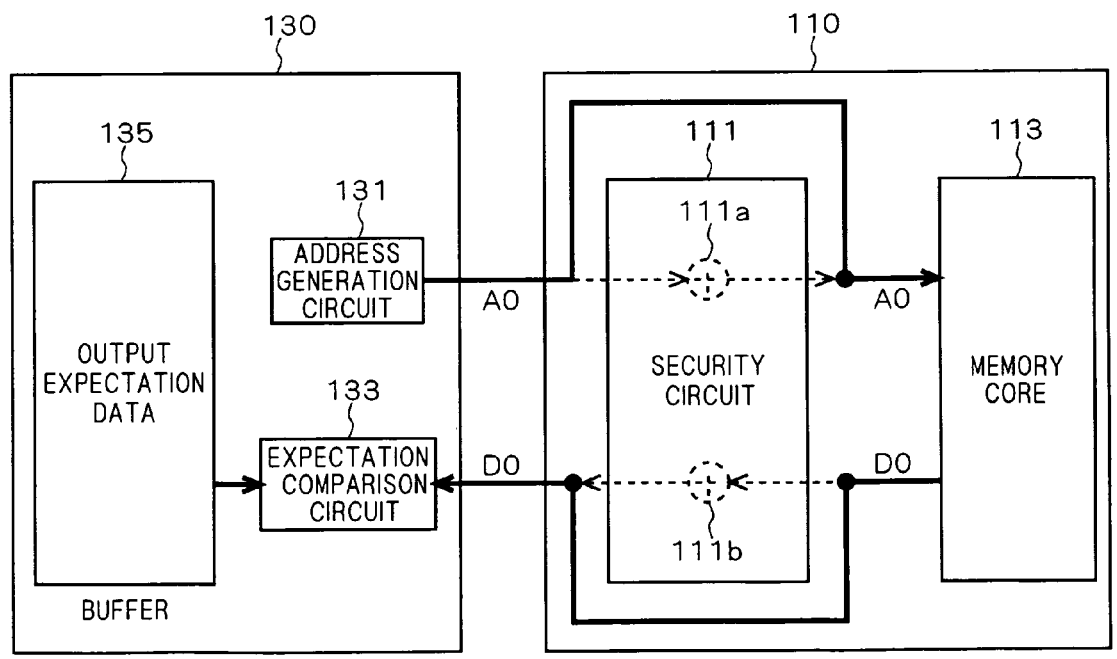
Figure 10:
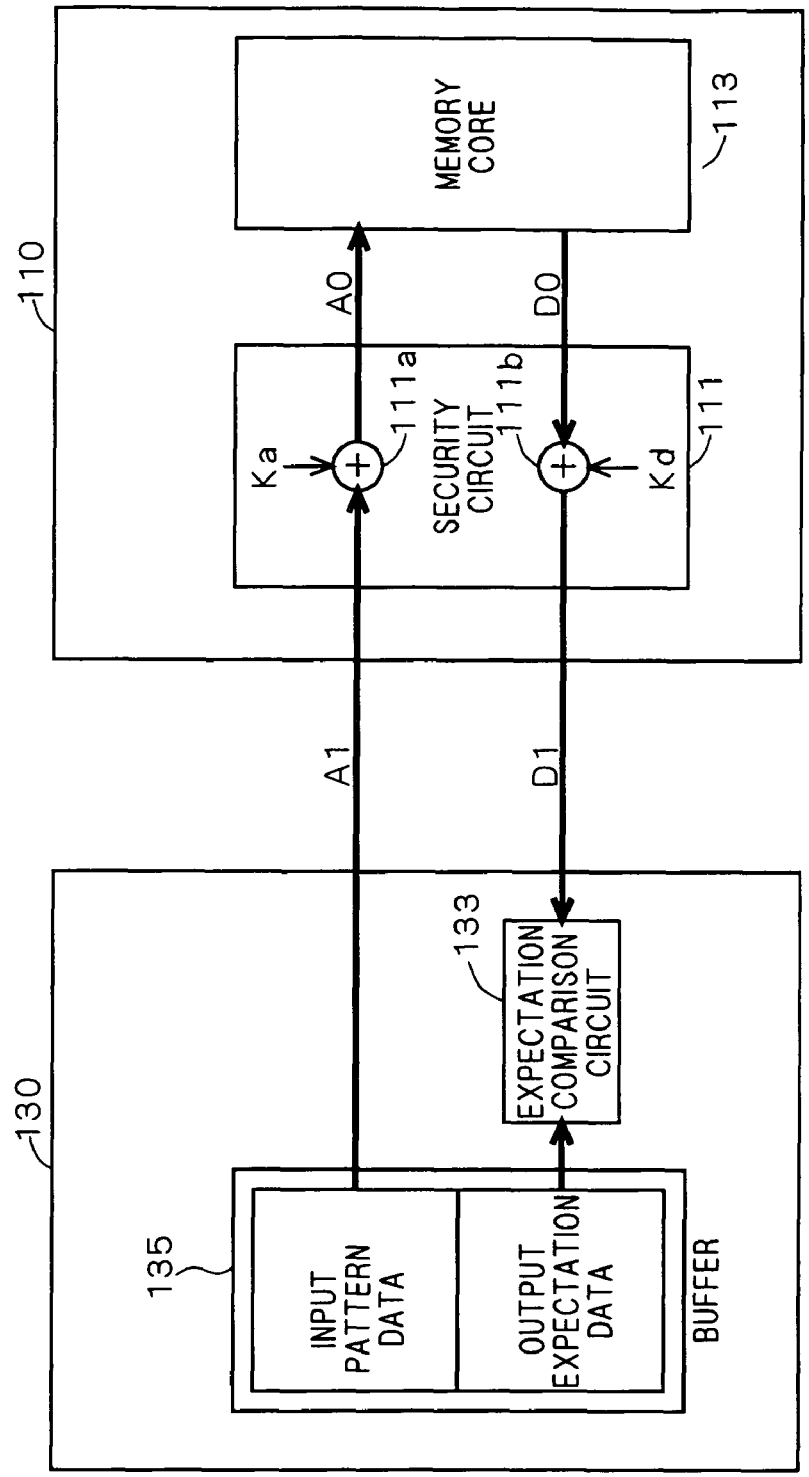

Next, it will be discussed with reference to FIG. 5 how the semiconductor memory 10 operates in a normal mode. In the normal mode, no test is implemented and an external information processor is allowed to access data stored in the semiconductor memory 10.

A scrambled address A6 is supplied in the normal mode from an information processor 40 to the semiconductor memory 10. In the semiconductor memory 10, the received address A6 is sent to the security circuit 11 in the normal mode. That is, the switching circuit 15 is controlled to provide a received signal to the security circuit 11, whereby the address A6 is descrambled to obtain an address A7.

In the normal mode, the address A7 is controlled to bypass the address conversion circuit 12. That is, the switching circuit 16 is controlled to provide a received signal to the path 23b. Then the address A6 received at the input end 21 is subjected to descrambling at the operation circuit 11a to be converted to the address A7. The address A7 is supplied to the memory core 13. Then the memory core 13 sends the contents data CT as data D6 stored at the address A7.

In the normal mode, the data D6 given from the memory core 13 (contents data CT) is sent to the security circuit 11. That is, the switching circuit 17 is controlled to provide a received signal to the security circuit 11, whereby the data D6 given from the memory core 13 (contents data CT) is scrambled at the operation circuit 11b to be converted to data D7. Then the data D7 is sent through the output end 22 to the information processor 40.

Thus in the semiconductor memory 10 of the preferred embodiment of the present invention, the address conversion circuit 12 is bypassed to realize the operation in the normal mode.

As discussed, in the semiconductor memory 10 of the preferred embodiment of the present invention, a received address is converted at the address conversion-circuit 12 to read the check pattern CP from fixed addresses in the implementation of the total function test. Thus the check pattern CP can be shared among different types of semiconductor memories. This allows the output expectation data EP1 to be kept at constant values.

That is, a single combination of the input pattern data IP and the output expectation data EP1 can be applied to implement the total function test of various types of semiconductor memories with different contents.

The semiconductor memory 10 of the preferred embodiment of the present invention has switching circuits for bypassing the security circuit 11 and the address conversion circuit 12. Bypassing the security circuit 11 and the address conversion circuit 12 facilitates the memory-core-only-test which has also been implemented on conventional memories.

When the memory-core-only test and the total function test are implemented by different memory testers, the memory tester responsible for the total function test is allowed to use a fixed test pattern. Thus a burden of generating and replacing test pattern can be considerably reduced.

A burden of generating test pattern can also be reduced in the event that the memory-core-only-test and the total function test are implemented by a single memory tester.

Assuming that the key information Ka and Kd vary according to contents, both the input pattern data and output expectation data should be replaced according to the contents. In contrast, in the preferred embodiment of the present invention, the key information Ka and Kd for use in the total function test can be stored in the check pattern CP. In the implementation of the total function test, the address conversion circuit 12 is turned on to certainly read the key information Ka and Kd first from the check pattern CP. Then the key information Ka and Kd can be renewed first.

Thus even in a semiconductor memory in which the key information Ka and Kd vary according to contents, the constant key information stored in the check pattern CP is used in the implementation of the total function test to fix the input pattern data IP.

Thus according to the preferred embodiment of the present invention, the input pattern data IP can be kept constant even in a semiconductor memory in which a value for use in descrambling varies according to contents, namely, a semiconductor memory in which a security-protected address is released from the security protection in various ways according to the contents.

The check pattern CP preferably contains a well-considered data pattern. As an example, the check pattern CP preferably allows exhaustive use of as many buses and circuits as possible. When a semiconductor memory suffers from a specific problem, a likely problem or the like, the check pattern CP preferably allows exhaustive use of circuits and the like suffering from these problems. The number of addresses (patterns) to be applied as the input pattern data IP is not specifically limited. Further, a combination of addresses preferably allows exhaustive use of several address buses.

In the preferred embodiment of the present invention, the security circuit 11 is responsible for scrambling and descrambling using exclusive OR's to protect data being transmitted. However, data may be security-protected in an alternative manner.

The security protection of address or data may be provided in various ways. As an example, the security circuit 11 may be given security features using encryption system such as RSA algorithm. In this case, in the implementation of the memory-core-only-test, the security circuit 11 (RSA security mechanism) and the address conversion circuit 12 are bypassed to perform reading from the memory in its entirety. In the implementation of the total function test, addresses and data are processed at the security circuit 11 (RSA security mechanism). The address conversion circuit 12 converts a received address to an address that designate only a region for storing the check pattern CP.

In the preferred embodiment of the present invention, both addresses and data are subjected to security protection and security release at the security circuit 11. The present invention is also applicable to a semiconductor memory in which either address or data is subjected to security protection and security release. In this case, in the implementation of the memory-core-only-test, the security circuit 11 and the address conversion circuit 12 are bypassed to perform reading from the memory in its entirety. In the implementation of the total function test, an address or data to be subjected to security protection and security release is processed at the security circuit 11. The address conversion circuit 12 converts a received address to an address that designate only a region for storing the check pattern CP.

In the preferred embodiment of the present invention described above, the high-order three bits of an address are masked as "111" at the address conversion circuit 12. However, such address conversion loses the information in the high-order three bits, failing to detect an error of the high-order three bits.

In response, as an another example of address conversion, the high-order three bits of an address as a target of conversion is added to the address itself. Thereafter the high-order three bits of the address after addition is masked. The address after masking contains the information in the high-order three bits of the address before conversion. This address conversion is preferable in terms of test of the security circuit 11, though it requires slightly complicated process. That is, an error generated in the high-order three bits of an address changes the data read from the check pattern CP, thereby allowing detection of the error.

The semiconductor memory 10 is not necessarily a mask ROM. The present invention is applicable to generally-used types of semiconductor memories.

While the invention has been shown and described in detail, the foregoing description is in all aspects illustrative and not restrictive. It is therefore understood that numerous modifications and variations can be devised without departing from the scope of the invention.

What is claimed is:

1. A semiconductor memory, comprising:
a memory core having a predetermined storage region storing a check pattern, the check pattern including first key information and second key information;
a security processing circuit including at least a security release circuit and a security protection circuit, said security release circuit being configured to release an address received at the semiconductor memory from scrambling subjected to first security protection from said first security protection based on the first key information obtained from the memory core when in a first testing mode, said security protection circuit being configured to provide second security protection to scramble data sent from said memory core based on the second key information obtained from the memory core when in the first testing mode;
an address conversion circuit configured to convert the address released from the first security protection by the security release circuit to an address designating the predetermined storage region;

a first path configured to allow an unprotected address received at said semiconductor memory to bypass said security processing circuit;

a second path configured to allow the unprotected address received at the semiconductor memory to bypass the address conversion circuit; and a third path configured to allow the data sent from the memory core to bypass the security processing circuit.

2. The semiconductor memory according to claim 1, wherein said check pattern is independent of data stored in a region in said memory core other than said predetermined storage region.

3. A method, implemented on a system including a semiconductor memory, of testing the semiconductor memory, the system including a memory core having a predetermined storage region storing a check pattern, the check pattern including first key information and second key information, a security processing circuit including at least a security release circuit and a security protection circuit, said security release circuit being configured to release an address received at the semiconductor memory from scrambling subjected to first security protection from said first security protection based on the first key information obtained from the memory core when in a first testing mode and said security protection circuit being configured to provide second security protection to scramble data sent from said memory core based on the second key information obtained from the memory core when in the first testing mode, an address conversion circuit configured to convert the address released from the first security protection by the security release circuit to an address designating the predetermined storage region, a first path configured to allow an unprotected address received at said semiconductor memory to bypass said security processing circuit, a second path configured to allow the unprotected address received at said semiconductor memory to bypass said address conversion circuit, and a third path configured to allow the data sent from the memory core to bypass the security processing circuit, said method comprising:

providing input pattern data subjected to said first security protection to said security release circuit to obtain said address released from the first security protection;

sending said address released from the first security protection from said security release circuit to said address conversion circuit to obtain said address designating said predetermined storage region;

providing said address designating said predetermined storage region to said memory core to obtain said check pattern; and making a comparison between data given from said semiconductor memory based on said check pattern and an expectation of said data.

4. A method, implemented on a system including a semiconductor memory, of testing the semiconductor memory, the system including a memory core having a predetermined storage region storing a check pattern, the check pattern including first key information and second key information, a security processing circuit including at least a security release circuit and a security protection circuit, said security release circuit being configured to release an address received at the semiconductor memory from scrambling subjected to first security protection from said first security protection based on the first key information obtained from the memory core when in a first testing mode and said security protection circuit being configured to provide second security protection to scramble data sent from said memory core based on the second key information obtained from the memory core when in the first testing mode, an address conversion circuit configured to convert the address released from the first security protection by the security release circuit to an address designating the predetermined storage region, a first path configured to allow an unprotected address received at said semiconductor memory to bypass said security processing circuit, a second path configured to allow said data sent from said memory core to bypass said security processing circuit, and a third path configured to allow the unprotected address received at said semiconductor memory to bypass said address conversion circuit, said method comprising:

providing said address released from the first security protection by the security release circuit to said address conversion circuit to obtain said address designating said predetermined storage region;

providing said address designating said predetermined storage region to said memory core to obtain said check pattern;

providing said check pattern to said security protection circuit to provide said second security protection to said check pattern; and making a comparison between data given from said security protection circuit and an expectation of said data.

5. The semiconductor memory according to claim 1, wherein the second path is further configured to allow the address released from the first security protection by the security release circuit to bypass the address conversion circuit.

6. The semiconductor memory according to claim 5, wherein the security release circuit releases the address received at the semiconductor memory subjected to the first security protection from the first security protection and the address conversion converts the address released from the first security protection to the address designating the predetermined storage region when the semiconductor memory is in the first testing mode, the first path allows the unprotected address received at the semiconductor memory to bypass the security processing circuit and the second path allows the unprotected address received at the semiconductor memory to bypass the address conversion circuit when the semiconductor memory is in a second testing mode, and the security release circuit releases the address received at the semiconductor memory subjected to the first security protection from the first security protection and the second path allows the address released from the first security protection by the security release circuit to bypass the address conversion circuit when the semiconductor memory is in a third mode.

7. The semiconductor memory according to claim 1, wherein the first path, the second path, and the third path are controlled based on a plurality of modes including the first testing mode.

* * * * *